United States Patent
Pazmino et al.

(10) Patent No.: US 7,024,048 B2
(45) Date of Patent: *Apr. 4, 2006

(54) METHOD OF COMPRESSING AND/OR DECOMPRESSING A DATA SET USING SIGNIFICANCE MAPPING

(75) Inventors: Edward A. Pazmino, Los Angeles, CA (US); Tinku Acharya, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/759,474

(22) Filed: Jan. 15, 2004

(65) Prior Publication Data

US 2004/0146208 A1    Jul. 29, 2004

Related U.S. Application Data

(63) Continuation of application No. 09/151,336, filed on Sep. 11, 1998, now Pat. No. 6,731,807.

(51) Int. Cl.
*G06K 9/46* (2006.01)
*G06K 9/36* (2006.01)

(52) U.S. Cl. ...................... 382/253; 382/240
(58) Field of Classification Search ........ 382/232–236, 382/224, 240, 242–248, 250–253; 348/422
See application file for complete search history.

(56) References Cited

U.S. PATENT DOCUMENTS

| 4,987,480 A | 1/1991 | Lippman et al. |
| 5,596,659 A | 1/1997 | Normile et al. |

(Continued)

OTHER PUBLICATIONS

Gersho, Allen, et al, "Finite-State Vector Quantization," Vector Quantization and Signal Compression, Kluwer Academic Publishers, pp. 519-537. (1991).

(Continued)

*Primary Examiner*—Andrew W. Johns
*Assistant Examiner*—Amir Alavi
(74) *Attorney, Agent, or Firm*—Sharon Wong

(57) ABSTRACT

Briefly, in accordance with one embodiment on the invention, a method of compressing a data set includes the following. In multiple passes, each data signal in the data set is categorized into a category of a predetermined set, and, for selected categories of the predetermined set, the data signals for that category are coded using a codebook for that category.

Briefly, in accordance with another embodiment of the invention, a method of decompressing a compressed data set includes the following. For compressed data signals in the data set in one category of a predetermined set of categories, a signal associated with the particular category is employed for the compressed data signal, and, for selected categories of the predetermined set, the compressed data signals for that category are decoded using a codebook for that category.

19 Claims, 1 Drawing Sheet

U.S. PATENT DOCUMENTS

| | | |
|---|---|---|
| 5,612,747 A | 3/1997 | Hartung et al. |
| 5,640,159 A | 6/1997 | Furlan et al. |
| 5,668,897 A | 9/1997 | Stolfo |
| 5,692,012 A | 11/1997 | Virtamo et al. |
| 5,717,787 A | 2/1998 | Feo et al. |
| 5,909,513 A | 6/1999 | Liang et al. |
| 6,124,882 A | 9/2000 | Voois et al. |
| 6,215,910 B1 | 4/2001 | Chaddha |
| 6,275,614 B1 | 8/2001 | Krishnamurthy et al. |

OTHER PUBLICATIONS

Shapiro, Jerome M., "Embedded Image Coding Using Zerotrees of Wavelet Coefficients," IEEE Transactions on Signal Processing, vol. 41, No. 12, Dec. 1993, pp. 3445-3462.

METHOD OF COMPRESSING AND/OR DECOMPRESSING A DATA SET USING SIGNIFICANCE MAPPING

This application is continuation of Ser. No. 09/151,336, filed Sep. 11, 1998, now U.S. Pat. No. 6,731,807.

BACKGROUND

1. Field

The present invention relates to compression and/or decompression of a data set using significance mapping.

2. Background Information

As is well-known, compression and decompression of data signals is employed in a variety of circumstances. Vector quantization is a well-known technique to achieve high performance signal compression. For example, although the invention is not limited in scope in this respect, it may be desirable to compress video signals, such as an image, a sequence of images, audio signals, or any combination thereof. Compression may typically be employed for purposes of storage or in order to transmit signals over a limited bandwidth communication link, although the invention is not limited in scope in this respect.

Many forms of compression suffers from several disadvantages. For example, compression is typically computationally complex. Therefore, compression techniques that are less computationally complex are sometimes desirable. Likewise, compression is not typically adaptable to achieve a particular bit rate, as may be desirable in some circumstances, such as where transmission is taking place over a limited bandwidth communications link, for example. Therefore, a need exists for compression techniques that address these shortcomings.

SUMMARY

Briefly, in accordance with one embodiment on the invention, a method of compressing a data set includes the following. In multiple passes, each data signal in the data set is categorized into a category of a predetermined set, and, for selected categories of the predetermined set, the data signals for that category are coded using a codebook for that category.

Briefly, in accordance with another embodiment of the invention, a method of decompressing a compressed data set includes the following. For compressed data signals in the data set in one category of a predetermined set of categories, a signal associated with the particular category is employed for the compressed data signal, and, for selected categories of the predetermined set, the compressed data signals for that category are decoded using a codebook for that category.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

Figure 1:
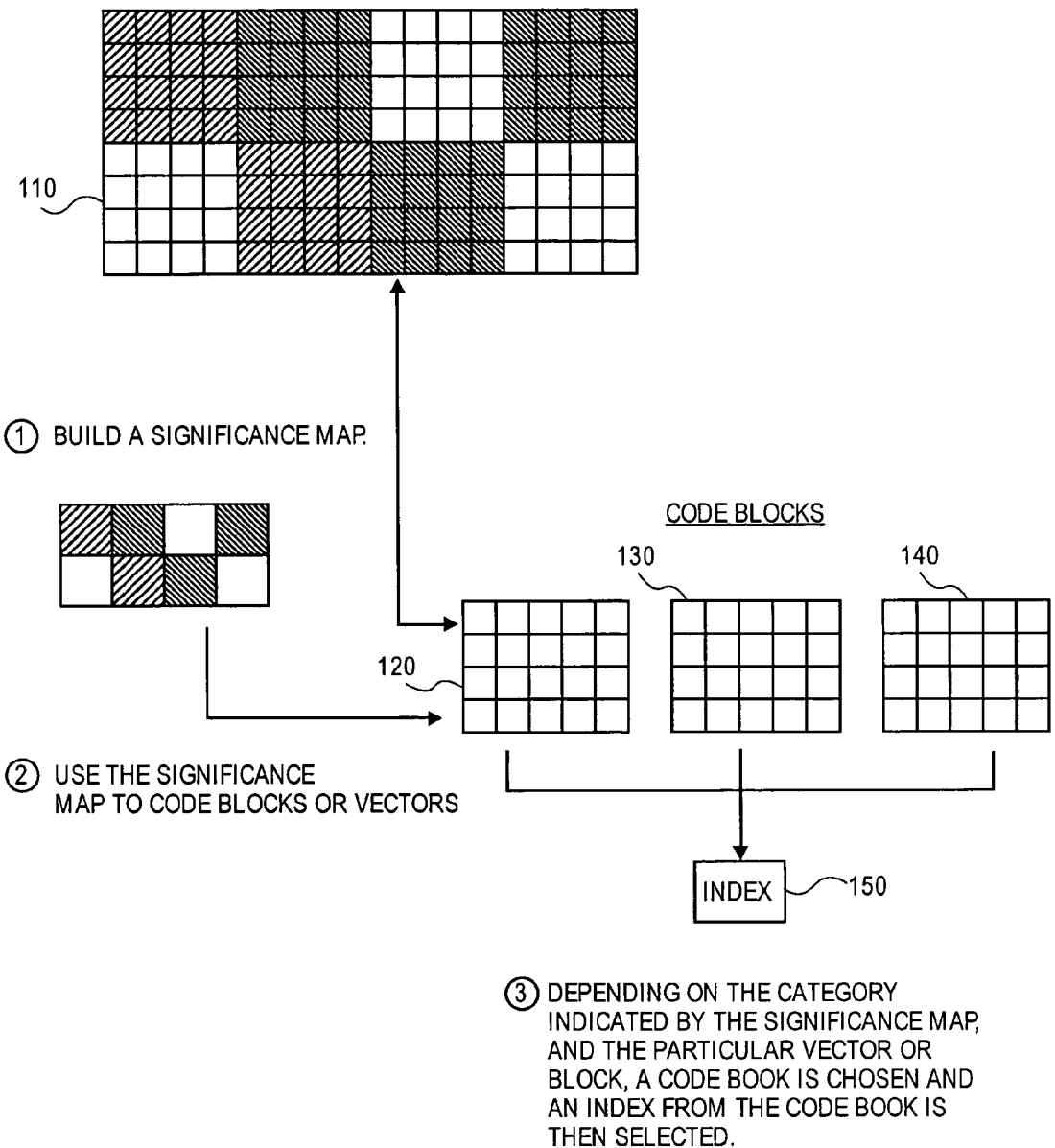
FIG. 1 is a diagram illustrating an application of an embodiment of a method of compressing a data set in accordance with the present invention.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As previously described, compression and decompression of a data set may be employed in a variety of situations. For example, it may be desirable to compress a data set representing an image, audio signals, a sequence of images, or any combination thereof. The invention is not limited in scope to any particular application; nonetheless, for this particular embodiment, compression and decompression will be applied for the purposes of illustration to a 640 by 480 pixel image. As is well-known, one technique employed to compress a data set, such as a data set representing an image, for example, is referred to as vector quantization. See, for example, *Vector Quantization and Signal Compression*, by Allen Gersho and Robert Gray, published by Kluwer Academic Publishers, 1991.

In vector quantization, the data set is partitioned into non-continuous blocks of a fixed size. A particular block is then compared to a codebook containing a limited number of representative vectors. Techniques to produce a codebook of representative vectors are well-known and will not be discussed in detail here. However, one typical approach is to employ a minimum least squares (MLS) technique to produce the codebook. Typically, such processes are iterative, although the invention is not limited in scope to a MLS or iterative technique.

Once a codebook of representative vectors is determined or exists, in order to apply vector quantization, a codebook vector is chosen from the set of representative vectors in the codebook that minimizes a predetermined distortion criteria for a particular block and the index of that codebook vector is either transmitted or stored as representative of the particular block. Again, although the invention is not limited in scope in this respect, a minimum least squares (MLS) approach may be employed in order to select the codebook vector that minimizes the predetermined distortion criteria. Therefore, in effect, the codebook vector that most closely matches the block being compressed is chosen. Where compression is being applied in order to transmit a signal across a limited bandwidth communications link, although the invention is not limited in scope in this respect, the codebook and its associated indexes are available at both the receiving end and the transmitting end of the communications link. Therefore, by transmitting only the index for the codebook vector, rather than the block being compressed or the codebook vector itself, compression is accomplished. For example, consider a 640 by 480 pixel image. For a block size of 4 by 4, one would partition the image into 19,200 blocks. Likewise, if the codebook contained 256 4 by 4 entries or vectors, one would transmit an eight bit value ($2^8$ is 256) that would identify the particular code book entry for each block. Therefore, in this particular example, 16:1 compression is accomplished, assuming each block entry is eight bits long. Again, the invention is, of course, not limited in scope to any of the values previously described in this example.

This particular compression technique has a few disadvantages. For example, assume a predetermined bit or binary digital signal "budget" exists. This budget may originate because, for example, the image is to be compressed to fit in a predetermined-sized storage medium. If the budget is such that 16:1 compression is not sufficient, for example, then, while transmitting the image or while storing the image, the budget will be exceeded. Such a budget may also exist due at least in part to the bandwidth limitations of the system, such as where a predetermined number of bits may be transmitted in a particular unit of time. So, for example, if it is desirable to transmit a sequence of images, a predetermined amount of time may be allocated to transmit a single image and the bandwidth limitations of the particular system may be exceeded, depending upon the compression ratio accomplished.

Another disadvantage of the particular approach employed is that signal information is typically lost in the compression process. For example, the reconstruction or decompression process does not produce the exact data set that existed prior to compression. Employing the previously described compression technique, for example, relatively more important signal information may be lost just as easily as relatively less important signal information, once the process is complete. For example, it might be desirable for relatively low frequency signal information to be lost since the impact of losing such information is typically less in terms of the resulting image, after reconstruction or decompression. However, in the previously described technique, signal information is lost in general without regard to the frequency content of the signal information.

FIG. 1 is a schematic diagram illustrating an embodiment of a method of compressing a data set in accordance with the present invention. In this particular embodiment, in multiple passes, each data signal in the data set is categorized into a category of a predetermined set of categories, and, for selected categories of the predetermined set, the data signals are coded for that category using a codebook for that category, as shall be explained in more detail hereinafter. For this particular embodiment, as previously indicated, in order to improve either the quality of the resulting image and/or the compression ratio achieved, a first pass is performed over the data set to produce or construct a significance map of the data set. In this first pass, blocks of a predetermined size, such as 4 by 4, for example, although the invention is not limited in scope in this respect, are classified or categorized according to a predetermined criteria. Typically, although the invention is not limited in scope in this respect, the criteria will be based, at least in part, on the particular values of each of the data signals in the data set. For example, although the invention is not limited in scope in this respect, where binary digital signals or bits are employed, the absolute value of the sum of the bits may be employed as a criteria to measure, for example, the energy of the data signal. Again, as one example, although the invention is not limited in scope in this respect, assuming a 640 by 480 pixel image divided into 19,200 blocks where the block size is 4 by 4, the data signals may be catagorized into one of four catagories. One advantage of employing four categories, although, again the invention is not limited in scope in this respect, is that four is a power of two and, therefore, may be represented by two binary digital signals that may be employed to represent each data signal categorized or assigned to a particular category once the first pass has been performed. Thus, by applying this first pass, a crude form of compression is accomplished in that each data signal in the data set may be represented by a two bit binary digital signal that indicates the category into which that data signal has been categorized or assigned.

As previously indicated, in this particular embodiment, the blocks may be classified according to a criteria representative of the energy of the data signal such as, in this particular example, the absolute sum of the bits of the particular data signal. Of course, where the absolute sum of the data signals in the data set is determined, the four categories may be determined or selected from highest absolute sum to lowest absolute sum over all the data signals in the image, where the division among each of the four categories based on absolute sum may vary depending upon the particular situation and the compression that is desired. Thus, in this embodiment, values may be determined that categorize the data signals into one of four categories based on where the absolute sum falls in terms of the values determined. Furthermore, in this particular example or embodiment, the categories have a rank order from highest to lowest and, likewise, the data signals in each category have a rank order from highest to lowest, again, based on the particular binary digital signals for that particular data signal.

Although the invention is not limited in scope in this respect, each of the four categories may have a different codebook. In an alternative embodiment, the higher rank order categories may each have a codebook and the lower rank categories may not have a codebook because, as shall be explained in more detail hereinafter, in alternative embodiments, the lower rank order categories may not be further coded. Likewise, again, although the invention is not limited in scope in this respect, each of the rank order categories may have the same codebook, although that particular embodiment may produce lower quality results in terms of the resulting image. Nonetheless, such an embodiment may employ less computational complexity because only a single codebook is determined and applied.

In a second pass over the data set, in order to continue the compression, select categories of the predetermined set may be coded. More particularly, the data signals for those categories may be coded using a codebook for that particular category. As previously described in this particular embodiment, the categories have a rank order and, therefore, it may be desirable to code the higher rank order categories before the lower rank order categories. Although the invention is not limited in scope in this respect, an advantage of coding the higher rank order categories before the lower rank order categories may occur where a predetermined binary digital signal budget is employed, as previously described. Where such a budget exists, by coding the higher rank order categories before the lower rank categories, the higher energy data signals, in this particular embodiment, are coded before the lower energy data signals. Therefore, an advantage of this particular embodiment is that the less important signal information, in terms of energy in this particular embodiment, will be lost as a result of compression. Likewise, within a particular category, it is desirable to code the higher rank order data signals before the lower rank order data signals. Again, where a budget is employed, this suggests that once the budget is expended for this particular embodiment, the higher order data signals will have been coded whereas the lower order data signals that are not coded represent less important signal information in terms of energy or in terms of some other predetermined criteria in another embodiment. Of course, in alternative embodiments, a criteria other than the absolute sum of the pixels may be employed in order to rank the categories and the data signals.

For example, although the invention is not limited in scope in this respect, a criteria that is representative of the frequencies that the human eye has the ability to detect may be employed. Therefore, those data signals representing the frequencies that the human eye has the capability to detect, when an approach such as previously described is employed, will be coded and the data signals representing frequencies that the human eye is unable to detect will not be coded. Therefore, the signal information that is lost as a result of compression in such an embodiment is the signal information that is less important, according to such a predetermined criteria. The invention is of course not limited in scope to any particular criteria being applied.

Returning to the previous example, in which 19,200 blocks for an image are divided into four categories, if 50% of the blocks fall below a predetermined threshold, such as a threshold for the absolute sum of the pixel values for each data signal, then those blocks would be compressed at a 64:1 compression ratio. Then, as previously described, in order to use a predetermined bit budget effectively, the remaining 50% of the blocks may be coded using a different codebook for each category. This approach of employing a different codebook for the higher rank order categories reduces the distortion that results from quantization, since a code book may be "tuned" for a particular category.

In another alternative embodiment, after a first pass, in which each of the data signals in the data set have been categorized into a category of a predetermined set of categories, the codebooks may be selected to ensure that a predetermined binary digital signal budget will not be exceeded when coding the entire image. Alternatively, in still another embodiment, after the significance map has been created, as previously described, first, the most significant vectors may be coded in the highest rank order category. If the bit budget has not been exceeded, then the next highest category may be encoded. This may continue until expending the entire bit budget or until encoding all the blocks. Alternatively, in one more embodiment, it could be determined, after categorization on a first pass, that for blocks that fall below some threshold on successive passes on the data set, no other bits will be allocated to those blocks. Thus, the entire bit budget may be allocated to the blocks above the threshold. Likewise, depending upon how many categories that represents, the bit budget may be allocated between the various categories based upon a particular desired result with respect to the compression.

Referring to FIG. 1, 110 comprises a portion of a data set which, in this particular example, represents an image. As illustrated by the shading in FIG. 1, for the portion of the data set illustrated, the 4 by 4 blocks have been categorized into one of four categories, although only three of the four categories are illustrated in FIG. 1. The different categories in FIG. 1 are represented by different shading. Therefore, as previously described, in this particular embodiment, on a first pass, a significance map has been created. Then, in a second pass, the particular categories determined for the blocks are used to code the blocks.

Depending on the category chosen for a particular block, a codebook is chosen, such as codebooks 120, 130 or 140, and that codebook is employed to determine the vector in the codebook that most closely matches the particular block. As previously described, although the invention is not limited in scope in this respect, a minimum least squares (MLS) criterion may be employed. Once the particular vector in the codebook for that category that most closely matches the particular block is determined, an index, 150, corresponding to that vector may then be transmitted or stored, depending on the particular application. Because, in this particular embodiment, the category has already been determined on a first pass, the index for the vector from a particular codebook is sufficient information for storage or transmission to accomplish the compression. In this particular embodiment, although the invention is not limited in scope in this respect, three of the four categories have codebooks. Therefore, in this embodiment, the lowest rank order category is not coded further and these particular blocks are compressed or encoded by employing the binary digital signals that represent that particular category.

An advantage of this particular embodiment over some state of the art approaches is the predetermined codebooks or vendor vector quantization tables may be employed, rather than creating the codebook "on the fly". One reason "on the fly" code books are employed is to reduce the distortion that results when a codebook does not model well the statistics of the data. However, such a process of producing a codebook "on the fly" is typically quite computationally complex. Using an approach in accordance with the invention, such as for example, the embodiments previously described, distortion may be reduced by employing multiple codebooks, as previously described, instead of using one codebook to model the statistics of the data. An additional benefit to using a significance mapping is that a predetermined bit budget may not be exceeded and the image may be successfully compressed. Omitting "on the fly" processing provides an advantage, in that, this particular embodiment, or other embodiments in accordance with the present invention, is realizable both in hardware and in software, whereas, other approaches to compression may only be realizable in hardware due at least in part to the computational complexity of the approach.

As previously discussed, compression may be employed in a variety of applications. The invention is not restricted in scope to any particular application. Nonetheless, as previously indicated, compression may be employed to transmit signals across a bandwidth limited communications link. A typical example of such a communications link, although the invention is not limited in scope in this respect, is a communications link that may be employed in a network, such as a network coupling a plurality of computers or computing platforms communicatively. One example of such a network, although the invention is not limited in scope in this respect, is the Internet. Alternatively, in another embodiment, a network in which compression may be employed comprises a network of nodes, such as those coupling together different devices, such as input devices, output devices, peripherals and the like.

Likewise, yet another application, although again the invention is not limited in scope in this respect, for example, where the data set represents an image or a sequence of images may include a system in which a digital camera is employed. In such a system, a storage medium, such as, for example, a flash chip, although the invention is not limited in scope in this respect, may have compressed data signals stored thereon. Typically, although the invention is not limited in scope in this respect, the data signals have been compressed, as previously described, such as in multiple passes, categorizing each data signal in the uncompressed data set into a category of a predetermined set, and, for selected categories of the predetermined set, further coding the uncompressed data signals for that category using the codebook for that category. In such a system, it may be desirable that the system also include the capability to compress data signals for storage as well as decompress signals that have already been compressed. For example, an embodiment of a method of decompressing a compressed data set includes the following. For compressed data signals in the data set in one category of a predetermined set of categories, a signal may be employed for the compressed data signal that is a signal associated with the particular category, and, for selected categories of the predetermined set, the compressed data signals for that category may be decoded using a codebook for that category. Therefore, a system for processing data signals may include the capability to both compress the data signals, such as by employing the embodiments previously described, and may include the capability to decompress the data signals that have been compressed.

As previously described, an embodiment in accordance with the present invention may be embodied in hardware, software or a combination thereof. For example, although the invention is not limited in scope in this respect, where an embodiment is realized in software, a storage medium may have stored thereon data signals representing instructions, the instructions, when executed by a system recognizing instructions, resulting in: multiple passes over a data set, in which each data signal in the data set is categorized into a category of a predetermined set, and, for selected categories of the predetermined set, the data signals for that category are coded using a codebook for that category. Likewise, in another embodiment, a system may include such a storage medium and may further include, in addition, a system capable of recognizing the instructions. One such system capable of recognizing instructions may be a computer or personal computer, although the invention is not limited in scope in this respect.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A method of processing a data set comprising:
compressing the data set in multiple passes by categorizing each data signal in the data set into a category of a predetermined set, and, for selected categories of the predetermined set, coding the data signals for that category using a codebook for that category, wherein the data signals are coded so that a predetermined binary data signal budget is not exceeded and the categories have a rank order.

2. The method of claim 1, further comprising:
decompressing the date set by, for compressed data signals in the data set in a category of a predetermined set of categories, employing a particular data signal associated with the particular category, and, for selected categories of the predetermined set, decoding the compressed data signals for that category using a codebook for that category.

3. A method of compressing a data set comprising:
in multiple passes, characterizing each data signal in the data set into a category of a predetermined set, and, for selected categories of the predetermined set, coding the data signals for that category using a codebook for that category, wherein the data signals are coded so that a predetermined binary digital signal budget is not exceeded and the categories have a rank order.

4. The method of claim 3, wherein the data signals comprise binary digital signals.

5. The method of claim 4, wherein for the categories that are not coded, each data signal in that category is represented as the binary digital signals assigned to that category.

6. The method of claim 5, wherein the number of predetermined categories is a power of two.

7. The method of claim 5, wherein the codebook for each of the selected categories is different.

8. The method of claim 5, wherein the codebook for each of the selected categories is the same.

9. The method of claim 5, wherein, within a particular category, the data signals have a particular rank order, the higher rank order signals being coded before the lower order rank data signals until the budget is expended.

10. The method of claim 5, wherein the data signal is compressed for storage on a storage medium.

11. The method of claim 10, wherein the storage medium comprises a flash chip.

12. The method of claim 5, wherein the data set is compressed for transmission across a network.

13. The method of claim 12, wherein the network comprises the Internet.

14. The method of claim 5, wherein the data set comprises data representing one of an image, audio signals, a sequence of images, and any combination thereof.

15. A system for compressing data signals comprising a storage medium storing data signals representing instructions, the instructions, when executed by a system recognizing the instructions, resulting in:
multiple passes over a data set, categorizing each data signal in the data set into one category of a predetermined set, and, for selected categories of the predetermined set, coding the data signals for that category using a codebook for that category, wherein the data signals are coded so that a predetermined binary digital signal budget is not exceeded and the categories have a rank order; and further comprising:
a system capable of recognizing the instructions.

16. A system for processing data signals comprising: a storage medium storing compressed data signals, the data signals having been compressed as follows:
in multiple passes, categorizing each data signal in an uncompressed data set into one category of a predetermined set, and, for selected categories of the predetermined set, coding the uncompressed data signals for that category using a codebook for that category, wherein the data signals are coded so that a predetermined binary digital signal budget is not exceeded and the categories have a rank order and further comprising:
a system capable of decompressing the compressed data signals.

17. The system of claim 16, wherein the system comprises a digital camera.

18. The system of claim 16, wherein the system includes the capability to compress data signals for storage on said storage medium.

19. The system of claim 18, wherein the system comprises a digital camera.

* * * * *